(12) United States Patent
Kim

(10) Patent No.: US 11,088,316 B2
(45) Date of Patent: Aug. 10, 2021

(54) HELICAL DIELECTRIC ELASTOMER ACTUATOR

(71) Applicant: Embry-Riddle Aeronautical University, Inc., Daytona Beach, FL (US)

(72) Inventor: Daewon Kim, Ormond Beach, FL (US)

(73) Assignee: Embry-Riddle Aeronautical University, Inc., Daytona Beach, FL (US)

( * ) Notice: Subject to any disclaimer, the term of this patent is extended or adjusted under 35 U.S.C. 154(b) by 643 days.

(21) Appl. No.: 15/928,523

(22) Filed: Mar. 22, 2018

(65) Prior Publication Data

US 2018/0277740 A1    Sep. 27, 2018

Related U.S. Application Data

(60) Provisional application No. 62/639,853, filed on Mar. 7, 2018, provisional application No. 62/475,006, filed on Mar. 22, 2017.

(51) Int. Cl.
| | |
|---|---|
| *H01L 41/08* | (2006.01) |
| *H01L 41/083* | (2006.01) |
| *H01L 41/27* | (2013.01) |
| *H01L 41/09* | (2006.01) |
| *H01L 41/193* | (2006.01) |

(52) U.S. Cl.
CPC ........ *H01L 41/0836* (2013.01); *H01L 41/098* (2013.01); *H01L 41/193* (2013.01); *H01L 41/27* (2013.01)

(58) Field of Classification Search
CPC .. H01L 41/0836; H01L 41/098; H01L 41/193
See application file for complete search history.

(56) References Cited

U.S. PATENT DOCUMENTS 3,816,774 A * 6/1974 Ohnuki ................ H04R 17/005
                                                       310/332

OTHER PUBLICATIONS

Benslimane, M. Y., et al., "Dielectric electro-active polymer push actuators: performance and challengers", Polymer International, vol. 59, (2010), 415-421.

(Continued)

*Primary Examiner* — Derek J Rosenau
(74) *Attorney, Agent, or Firm* — Schwegman Lundberg & Woessner, P.A.

(57) ABSTRACT

A helical dielectric elastomer actuator (HDEA) can include a first dielectric region comprising an elastomer defining a helix. In an example, a dielectric material can be deposited and a compliant conductive material can be deposited, such as using an additive manufacturing approach, to provide an HDEA. In an example where the HDEA has multiple mechanical degrees of freedom, at least two compliant conductive regions can be located on a first surface of the first dielectric region and at least one compliant conductive region can be located on an opposite second surface of the first dielectric region. For such an example, the at least two compliant conductive regions can be arranged to be energized with respect to the at least one compliant conductive region in a manner providing at least two mechanical degrees of freedom for operation of the HDEA.

20 Claims, 9 Drawing Sheets

(56) References Cited

OTHER PUBLICATIONS

Brochu, P., et al., "Advances in dielectric elastomers for actuators and artificial muscles", Macromolecular Communications, 31, (2010), 10-36.

Carpi, F., et al., "Contractile Folded Dielectric Elastomer Actuators", Proceedings of the SPIE, Electroactive Polymer Actuators and Devices (EAPAD), Smart Structures and Materials, 6524, (2007), 14 pgs.

Carpi, F., et al, "Folded dielectric elastomer actuators", Smart Materials and Structures, vol. 16, (2007), S300-S305.

Carpi, F., et al., "Helical Dielectric Elastomer Actuators", Smart Materials and Structures, 14, (2005), 1-7.

Carpi, F., et al., "Small-strain Modeling of Helical Dielectric Elastomer Actuators", IEEE/ASME Transactions on Mechatronics, 17(2), (2012), 318-325.

Koford, G., "The Static Actuation of Dielectric Elastomer Actuators: How does Pre-stretch Improve Actuation?", Journal of Physics D: Applied Physics, 41(21), (2008), 1-11.

Kovacs, G., et al,, "Stacked dielectric elastomer actuator for tensile force transmission", Sensors and Actuators, A: Physical, 155, (2009), 299-307.

Pei, Q., et al., "Multiple-degrees-of-freedom electoelastomer roll actuators", Smart Materials Structures, 13, (2004), N86-N92.

Gbaguidi, Audrey, et al., "Analytical Approach on the Performance of Helical Dielectric Elastomer Actuator", *Proc. SPIE 9798, Electroactive Polymer Actuators and Devices (EAPAD)* 2016, 979814, (Apr. 15, 2016), 14 pages.

Park, Jang Ho, et al., "Numerical Analysis of Helical Dielectric Elastomer Actuator", *Proc. SPIE 10163, Electroactive Polymer Actuators and Devices (EAPAD)* 2017, 101631A, (Apr. 17, 2017), 9 pgs.

Park, Jang Ho, et al., "Optimization of Helical Dielectric Elastomer Actuator with Additive Manufacturing", *Proc. SPIE 10594, Electroactive Polymer Actuators ad Devices (EAPAD)*, 2018, 105940Z, (Mar. 27, 2018), 1-11.

\* cited by examiner

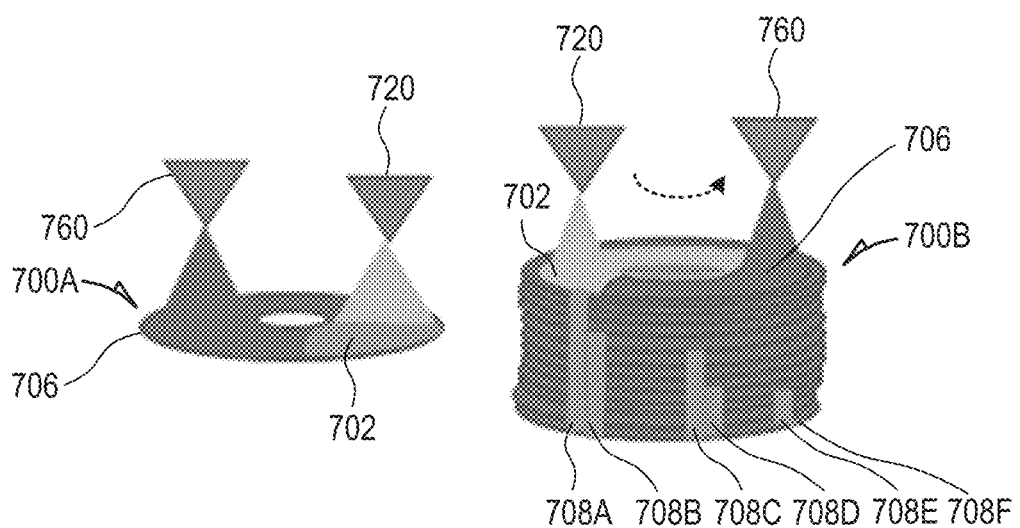
*FIG. 7A*  *FIG. 7B*
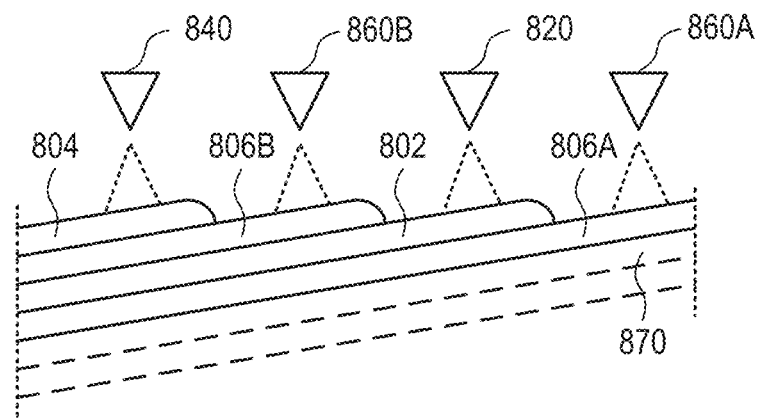
*FIG. 8*

HELICAL DIELECTRIC ELASTOMER ACTUATOR

CLAIM OF PRIORITY

This patent application claims the benefit of priority of each of (1) Kim, U.S. Provisional Patent Application Ser. No. 62/475,006, titled "HELICAL DIELECTRIC ELASTOMER ACTUATOR," filed on Mar. 22, 2017; and (2) Kim, U.S. Provisional Patent Application Ser. No. 62/639,853, titled "HELICAL DIELECTRIC ELASTOMER ACTUATOR," filed on Mar. 7, 2018; each of which is hereby incorporated by reference herein in its respective entirety.

FIELD OF THE DISCLOSURE

This document pertains generally, but not by way of limitation, to electromechanical actuators and related techniques such as for fabrication of such actuators, and more particularly, to dielectric elastomer actuators and techniques related thereto.

BACKGROUND

Electroactive polymer (EA) structures, such as including a dielectric elastomer, can exhibit strain in the presence of an applied electrostatic field. For a flexible structure, such strain can induce a change in the electroactive polymer, such as causing a displacement of the structure comprising the electroactive polymer.

SUMMARY OF THE DISCLOSURE

An actuator can be formed such as having a helical structure, wherein at least a portion of the helical structure comprises a dielectric elastomer. One or more electrodes, such as compliant electrodes, can be formed as a portion of a helical dielectric elastomer actuator (HDEA) assembly (HDEA). The present inventor has recognized, among other things, that use of a helical geometry for the dielectric elastomer actuator can provide displacement or other dynamic actuation behavior such as bending or torsional motion, according to various electrode configurations. Simulation results indicate that various analytical and numerical models can be used to predict actuator performance in view of such different electrode configurations and other parameters such as material constitutive parameters and structure dimensions. Fabrication of an HDEA assembly may in part include using a deposition process such as involving printing or otherwise dispensing constituent portions of the HDEA assembly.

In an example, a helical dielectric elastomer actuator (HDEA) can include a first dielectric region comprising an elastomer defining a helix, at least two compliant conductive regions located on a first surface of the first dielectric region, and at least one compliant conductive region located on an opposite second surface of the first dielectric region. In an example, the at least two compliant conductive regions can be arranged to be energized with respect to the at least one compliant conductive region in a manner providing at least two mechanical degrees of freedom for operation of the HDEA. For example, the at least two compliant conductive regions can be located at different angular positions around a central hollow region defined by the first dielectric region.

In an example, a method for providing a helical dielectric elastomer actuator (HDEA) can include depositing a first dielectric material to define a first dielectric layer, and depositing a first conductive material on a surface of the first dielectric layer to provide a first compliant electrode, where the first dielectric layer and the first conductive material define a helical structure extending in a longitudinal direction. In an example, the method can include depositing a second dielectric material to define a second dielectric layer and a second conductive material on surface of the second dielectric layer to provide a second compliant electrode, the first compliant electrode located on a surface of the first dielectric layer and the second compliant electrode located on an opposite surface of the first dielectric layer in a stack defined by the first and second dielectric layers.

In an example, a method for providing a helical dielectric elastomer actuator (HDEA) can include depositing a first dielectric material to define a first dielectric layer, depositing a first compliant conductive material on a surface of the first dielectric layer, the first compliant conductive material defining at least two compliant conductive regions arranged to be energized in a manner providing at least two mechanical degrees of freedom for operation of the HDEA. In an example, the first dielectric layer and the first compliant conductive material define a helical structure extending in a longitudinal direction, and depositing the first dielectric layer and the depositing the compliant conductive region include depositing the first dielectric layer and the first compliant conductive material using respective nozzles.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 7A and FIG. 7B illustrate generally examples showing generally how dielectric material and compliant conductive material layers might be fabricated using a deposition technique such as printing or dispensing, with FIG. 7A showing an initial or early state of such fabrication, and FIG. 7B showing a later state wherein multiple layers of material have been built up.

FIG. 8 illustrate generally an example showing generally how multiple dielectric material and multiple compliant conductive material layers might be fabricated serially using a deposition technique such as printing or dispensing.

DETAILED DESCRIPTION

Figure 1A:
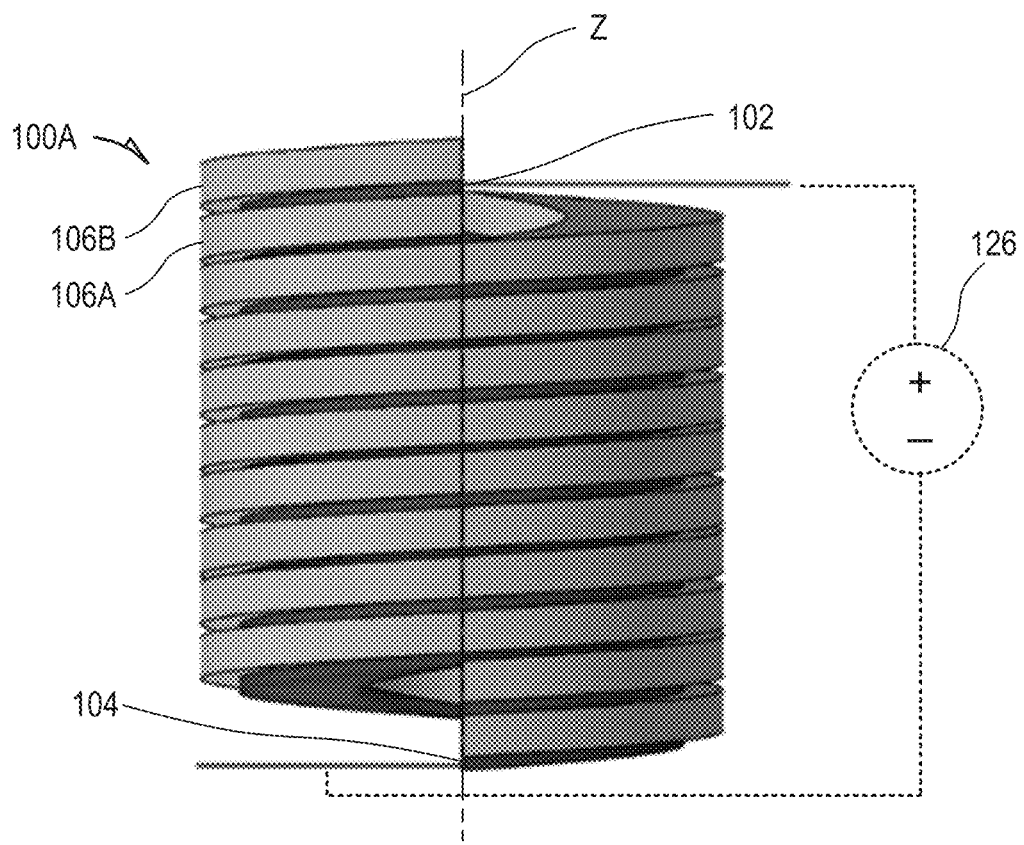
FIG. 1A illustrates generally a first view of an example that can include a helical dielectric elastomer actuator (HDEA) having compliant electrodes on opposite surfaces of a helical dielectric region.

Electro-active polymers (EAPs) are materials that behave as electrical insulators by nature but undergo physical change, such as shape or size, when electric fields are applied on them. EAPs can be classified by two categories known as the ionic EAPs and electronic EAPs, based on how the material responds to the applied electric fields. Among electronic EAPs, the dielectric elastomer has been used for the development of smart actuators. Generally, dielectric elastomer actuators (DEA) are capable of generating large deformations by transforming electrical energy directly into mechanical work. Actuators made of dielectric elastomers generally include an elastomer film sandwiched between thin layers defining compliant electrodes. The electrostatic pressure applied by the compliant electrodes to the insulating elastomer can be determined given a voltage and film thickness using Maxwell's stress. Due to the electrostatic pressure, the elastomer film experiences mechanical compression in the thickness direction. The electrostatic pressure has a relationship with the actuation voltage, which governs the compression of the elastomer layer. The voltage used for desired actuation is usually large and depends on the geometry of the elastomer. When used as actuators, it is desired to produce large strains relative to the applied voltage.

Among various types of dielectric elastomer configurations, the helical dielectric elastomer actuator (HDEA) is one type of electronic EAP actuator that can provide contractile and extendable capabilities, and can attain bending and torsion. The present inventor has recognized that various configurations of conductive regions included in an HDEA can be used to provide multiple mechanical degrees of freedom, such as combining a capability for extensional/contractile electromechanical behavior along with one or more of bending or torsional deformation. The pliability, low weight, potentially unlimited degrees of freedom, and biocompatibility of HDEA structures (depending on selected materials) make such structure suitable for a variety of applications, including biomedical applications involving prosthetics and implantations for rehabilitation, disability, or capacity enhancement, as illustrative examples.

In another application, an HDEA can be included as a portion of a "soft" robot, such as to perform sophisticated tasks traditional robots with rigid bodies find troublesome. As an illustrative example, one of the mechanical characteristics of an HDEA as might be provided using the approach herein is to achieve contractile motion of about 20% of the HDEA structure's initial length in a longitudinal direction. By contrast, other actuation technologies made from various materials might only be capable of reaching a few percent of displacement.

Generally, "hard" robots dominate the robotic engineering field. Among the traditional robotic actuators, electromagnetic actuators are known for high power to weight ratios, force to weight ratios, and high speed. But, such actuators can present drawbacks, such as being generally bulky and having limited degrees of freedom. By contrast, soft robots can address these drawbacks, such as providing one or more of mechanical flexibility, low weight, potentially unlimited degrees of freedom, and biocompatibility depending on the material. As mentioned above, HDEA structures may be utilized in a wide range of bioengineering applications such as attachable artificial muscles and prosthetics devices providing solutions to individuals who lack muscle or even a whole limb due to an injury. In another example, such HDEA structures might be used as the actuation system for surgical robots that can perform minimally invasive clinical procedures. Physicians or traditional rigid robots may not be not capable of performing such procedures due to the complexity of maneuvering in confined space.

Generally, HDEAs form a helical structure where layers of electrode and elastomer can alternate throughout the longitudinal axis (e.g., "height") of the structure. A challenge can exist with respect to fabrication complexity and actuation voltage for HDEA assemblies. To address such challenges, the present inventor has recognized, among other things, that a deposition or printing technique might be used for fabrication of HDEA structures, and such deposition or printing can be referred to generically as three-dimensional (3-D) printing technology or "additive manufacturing." The examples described herein, such as shown illustratively in FIG. 1A, FIG. 1B, FIG. 2A, FIG. 2B, and FIG. 3 might be fabricated using either a pre-stressed dielectric helical structure, such as wound on a mandrel or other form. In another approach, a portion or an entirety of the HDEA can be formed using additive manufacturing, including a deposition technique such as printing.

Figure 1B:
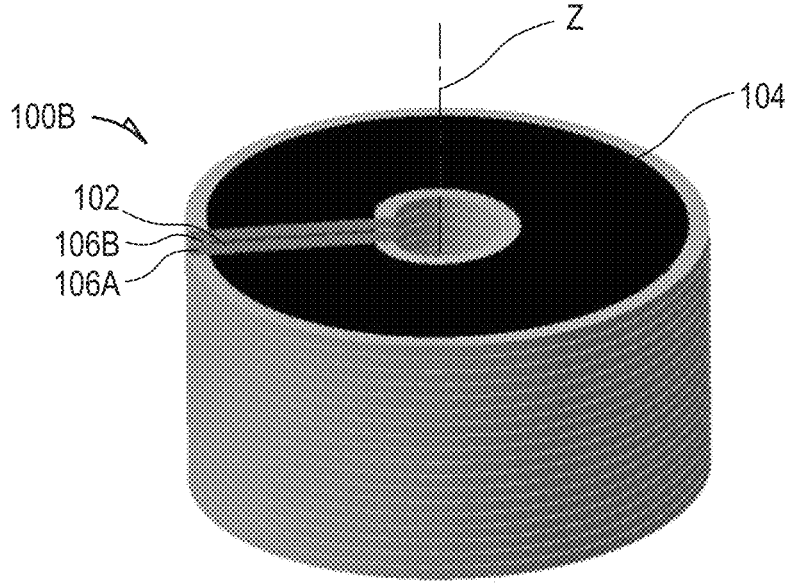
FIG. 1B illustrates generally a second view of an example that can include a helical dielectric elastomer actuator (HDEA) having compliant electrodes on opposite surfaces of a helical dielectric region.

FIG. 1A and FIG. 1B illustrate generally first view of examples that can include a helical dielectric elastomer actuator (HDEA) 100A in FIG. 1A and HDEA 100B in FIG. 1B, having compliant conductive regions defining electrodes on opposite surfaces of a first helical dielectric layer 106A.

Figure 2A:
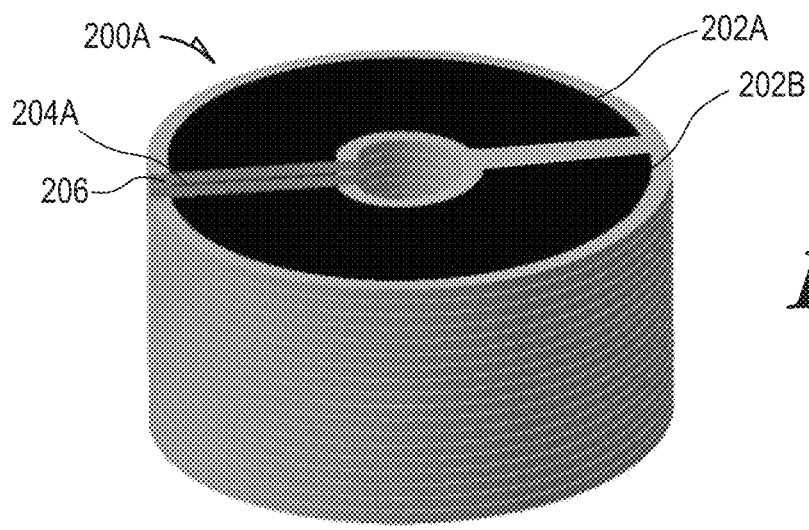
FIG. 2A and FIG. 2B illustrate generally respective examples having multiple degrees-of-freedom (DOF) such as can be provided by compliant electrodes located at different angular positions around a circumference of a helical dielectric elastomer actuator (HDEA).
Figure 2B:
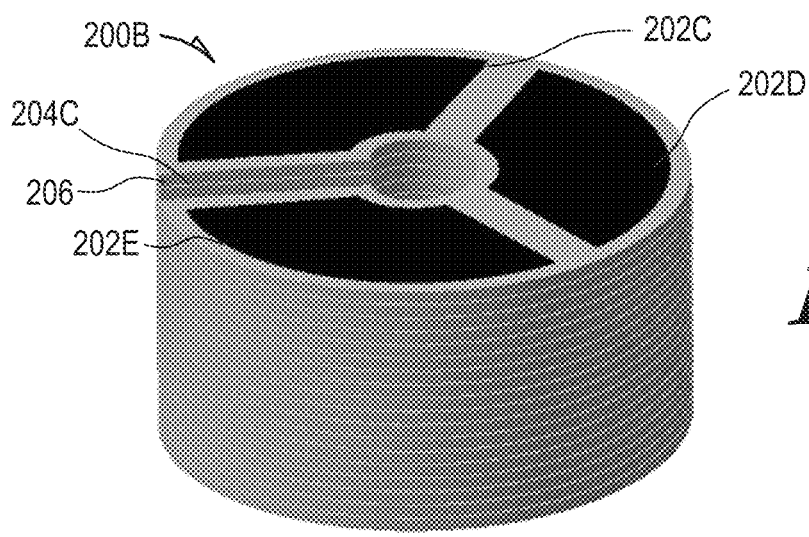

A layer including the first compliant conductive region 102 can define a first electrode (or multiple electrodes, as shown illustratively in FIG. 2A or FIG. 2B). A second compliant conductive region 104 can be located on a second surface of the first helical dielectric layer 106A opposite the first compliant conductive region. A second helical dielectric layer 106B can be stacked with the first helical dielectric layer 106A to isolate the first and second compliant conductive regions 104 and 102 from each other as shown illustratively in FIG. 1A and FIG. 1B. In this manner, the layers including first and second compliant conductive regions 102 and 104 are sandwiched between alternating layers of the first and second helical dielectric layers 106A and 106B. The HDEA 100A in FIG. 1A, or as shown in other examples, can be energized using a voltage source 126 or other control circuitry.

Generally, a dielectric elastomer actuator (DEA) can be regarded as a thickness variable capacitor that enables large mechanical deformations. The DEA is generally made of a film of an elastomer material that is clad on both sides with compliant electrodes. When an electric field is applied, the strain is induced along the thickness by electrostatic forces, called Maxwell's stress, resulting in thickness reduction of the applied electric field and elongation in the perpendicular direction. The activation pressure or Maxwell pressure can be determined using EQN. 1, below, such as defining an interplay between mechanical state and electrical field, $$\sigma = \varepsilon_r \varepsilon_0 E^2 \qquad \text{EQN. 1.}$$

The symbol, "σ" can represent an activation pressure, $\varepsilon_r$ ($\varepsilon_r$=4.8) can represent a relative dielectric constant of a dielectric layer comprising an elastomer, $\varepsilon_0$ can represent a dielectric permittivity of vacuum ($\varepsilon_0$=8.85×10$^{-12}$ F/m), and E can represent an electric field magnitude. This equation illustrates generally a relation between the amount of voltage applied to a DEA and a relative thickness to make it an effective actuator. Accordingly, if uniform electrodes are defined by the first and second compliant conductive regions 102 and 104, the HDEA can be energized to provide displacement (e.g., contraction) along a longitudinal axis, "Z" (shown as aligned vertically with the views of FIG. 1A and FIG. 1B), and thereby exhibits a single mechanical degree of freedom ("1-DOF").

FIG. 2A and FIG. 2B illustrate generally respective examples having multiple degrees-of-freedom (DOF) such as can be provided by compliant electrodes located at different angular positions around a circumference of a helical dielectric elastomer actuator (HDEA). In FIG. 2A, an HDEA 200A can provide two mechanical degrees of freedom ("2-DOF") using a first compliant conductive region 202A and a second compliant conductive region 202B located on the same surface of a dielectric layer 206. A common electrode or 204A can be located on a surface of the dielectric layer 206 opposite the first and second compliant conductive regions 202A and 202B.

In FIG. 2B, an HDEA 200B can provide three mechanical degrees of freedom ("3-DOF") using a first compliant conductive region 202C, a second compliant conductive region 202D, and a third compliant conductive region 202E, located at different angular positions around a central hollow region defined by a dielectric layer 206. In the examples of the HDEA 200A of FIG. 2A or the HDEA 200B of FIG. 2B, a bending motion can be obtained by independently energizing a particular conductive region separately using one or more of a polarity or voltage differing from other regions with respect to a common electrode (e.g., with respect to the conductive region 204A). If uniform compression along the longitudinal axis is desired, all of the electrodes (e.g., both the conductive regions 202A and 202B in FIG. 2A or each of the conductive regions 202C, 202D, and 202E in FIG. 2B) can be energized uniformly with respect to a common electrode (e.g., with respect to the conductive region 204A in FIG. 2A or 204C in FIG. 2B). Referring to FIG. 2B, the 3-DOF conductive region pattern defined by the first, second, and third conductive regions 202C, 202D, and 202E can also provide torsional deformation or "twisting" such as by applying different voltages to respective conductive regions 202C, 202D, and 202E. Dielectric regions nearby each of the compliant conductive regions 202C, 202D, and 202E can exhibit different voltage-induced mechanical compressions by which the HDEA 200B is able to bend The configurations shown in FIG. 2A and FIG. 2B are illustrative, and other compliant conductive region patterns can be used to provide various mechanical degrees of freedom. For example, conductive regions can be defined as isolated regions defined radially with respect to a central longitudinal axis, rather than angularly as shown in FIG. 2A and FIG. 2B. Conductive regions can be addressed such as using leads to feed various portions of the HDEA 200A or 200B in a segmented manner, as shown illustratively in FIG. 3.

Figure 3:
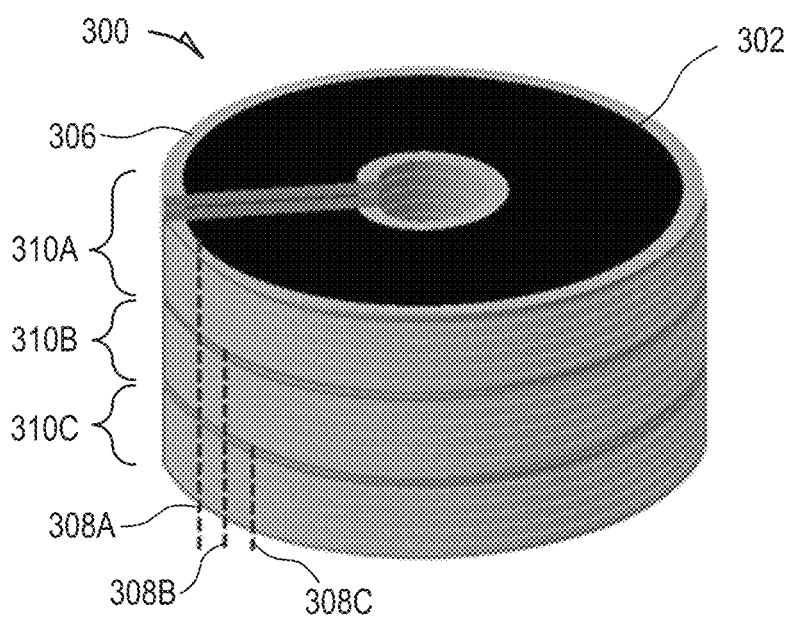
FIG. 3 illustrates generally an example including a helical dielectric elastomer actuator (HDEA) that can have multiple segments or sections that can be energized separately, such as to provide one or more of path resistance management, heat dissipation management, or selectable mechanical displacement.

FIG. 3 illustrates generally an example including a helical dielectric elastomer actuator (HDEA) 300 that can have multiple segments 310A, 310B, and 310C that can be energized separately, such as to provide one or more of path resistance management, heat dissipation management, or selectable mechanical displacement. As mentioned above, a voltage application in the 1-DOF actuator shown illustrative in FIG. 1A and FIG. 1B can be relatively simple since the conductive compliant regions define continuous electrodes. When the electrodes are non-continuous, a structure can be used to feed them, such as shown by the leads 308A, 308B, and 308C of FIG. 3. Such leads 308A, 308B, or 308C can connect conductive regions together between layers or such leads 308A, 308B, or 308C can be used to route electrical signals from locations along the HDEA 300 to an exterior-facing surface of the HDEA 300 for coupling to a voltage source or other control circuitry. One or more of the leads 308A, 308B, or 308C can be formed using materials similar to the compliant conductive regions (such as a region 302), or using other materials. As illustrative examples, silver-loaded adhesive, carbon grease, or the material matching the compliant conductive region 302 can be used to form leads 308A, 308B, or 308C.

According to various examples as shown illustratively in FIG. 1, FIG. 2A, FIG. 2B, and FIG. 3, a compliant conductive region, such as the region 302 in FIG. 3, defining an electrode area, can be smaller than a dielectric elastomer layer 306, such as to accommodate for electrical connections between electrodes. By doing so, the voltage can be applied in the top and bottom layer as with the 1-DOF electrode configuration, such as using one or more interconnecting leads 308A, 308B, or 308C. Generally, a conductive path formed by a conductive region (e.g. a region 302) will provide a relatively low resistance, given the dimensions of the printed conductor. As an illustrative example, conductor region can be thin (such as on the order of 25 millionths of a meter (microns) or less) and on the order of millimeters in width. Actuation current running through resistive materials may generate heat. Use of leads 308A, 308B, or 308C can assist with heat dissipation, such as acting as a heat sink. If the HDEA 300 provides a relatively high aspect ratio, the segmented approach shown in FIG. 3 can be used to feed individual segments 310A, 310B, or 310C separately or in parallel, such as to assist in one or more of reducing a total path resistance, enhancing heat dissipation, or allowing separate electromechanical control of different regions of the HDEA 300.

Illustrative Examples Including Modeled Results

Figure 4A:
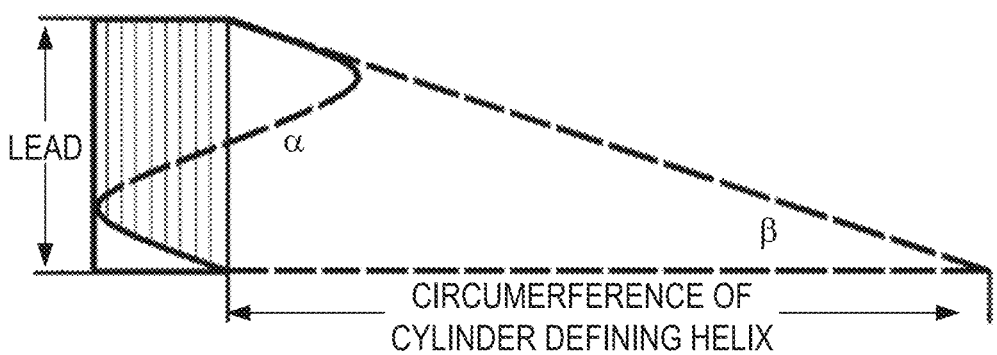
FIG. 4A and FIG. 4B illustrate generally examples showing various geometric parameters that can be used to one or more of describe or analytically model a helical dielectric elastomer actuator (HDEA).
Figure 4B:
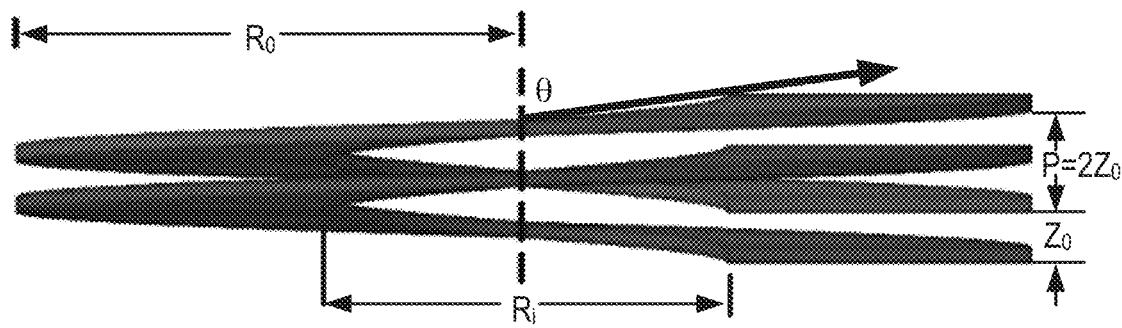

FIG. 4A and FIG. 4B illustrate generally examples showing various geometric parameters that can be used to one or more of describe or analytically model a helical dielectric elastomer actuator (HDEA). Detailed analytical models and related parameter exploration are outlined in (1) Kim, U.S. Provisional Patent Application Ser. No. 62/475,006, titled "HELICAL DIELECTRIC ELASTOMER ACTUATOR," filed on Mar. 22, 2017; and (2) Kim, U.S. Provisional Patent Application Ser. No. 62/639,853, titled "HELICAL DIELECTRIC ELASTOMER ACTUATOR," filed on Mar. 7, 2018. Geometric modeling of an HDEA structure can be studied by analyzing the geometry of a helicoid. The complex nature of the helicoid comes from the pitch angle that makes the geometry continuous thus making the calculation of the surface area more complex. As mentioned above, a surface area of Maxwell's stress equation can be used to formulate an electromechanical relationship of the actuator, as shown below in EQN. 2:

$$P_{el}=|F|/A = |\nabla U|/A=|\nabla(\tfrac{1}{2})CV^2|/A=\varepsilon_0\varepsilon_r E^2 \qquad \text{EQN. 2}$$

A "pitch" angle, ("$\alpha$") can be regarded as similar to what is called lead angle from the context of machine tools. A lead angle ("$\beta$") can be defined a measure of the inclination of a screw thread from a plane that is perpendicular to the screw thread axis [11]. This idea of lead angle can be used to find the pitch angle of the helicoid. Based upon the definition of lead angle as shown in FIG. 4A, the pitch angle of a helix can be described as an angle between the slanted surface and a plane perpendicular to the direction of the inclination. The lead angle, and a corresponding pitch angle can be determined by the following expressions:

$$\tan(\beta) = \frac{\text{Pitch}}{2\pi R_o}; \text{ and} \qquad \text{EQN. 3}$$

$$\tan\alpha = \frac{2\pi r R_o}{\text{Pitch}} \qquad \text{EQN. 4}$$

A pitch of the helicoid is Pitch=$2z_o$ where $z_o$ represents a thickness of the dielectric elastomer. In order to determine a contact surface area, with reference to the z-axis of the Cartesian coordinate system being the longitudinal axis of the HDEA, a cylindrical coordinate system can be used to describe the helicoid. Vertical displacement z of the helicoid can be described by a slant, c, and an azimuth angle $\theta$ in cylindrical coordinates. An inner and outer length of the helicoid can be represented as follows:

$$L_i, L_o = \int \partial L = \int_0^{2\pi}\sqrt{r^2+C^2}\partial\theta = 2\pi R_{i,o} \sec\beta \qquad \text{EQN. 5}$$

By substituting $$C = \frac{P}{2\pi}$$

and the pitch P to EQN. 5, an expression is obtained for the inner and outer length of the helicoid curve. When a single period of the helicoid is rectified, the area resembles a disk shape area enclosed by inner and outer length of the helicoid. A rectified surface of the helicoid actuator can be regarded as a disk and an area can be found by subtracting the smaller radius from the larger radius. An area of the helicoid for a single revolution can be found using the following expression:

$$\text{Area}=\pi\text{Actual }R_o{}^2-\pi\text{Actual }R_i{}^2=\pi r_o\sec\beta^2-\pi r_i\sec\beta^2 \qquad \text{EQN. 6}$$

Figure 4C:
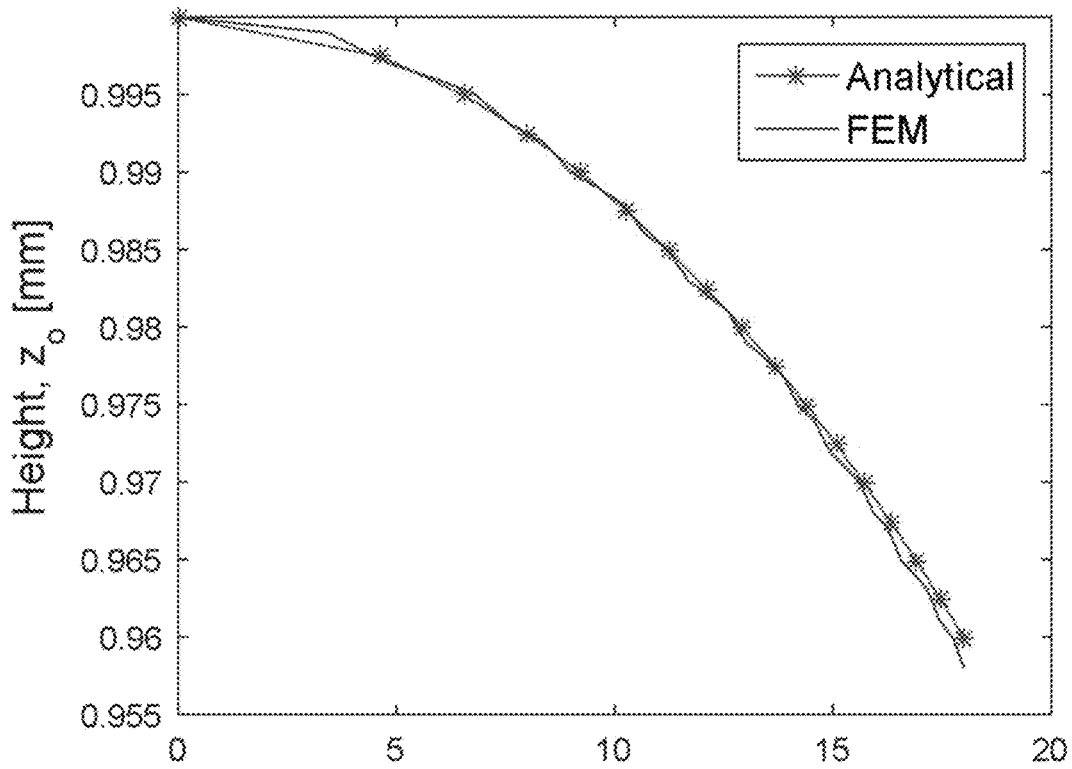
FIG. 4C illustrates generally an illustrative example of a simulated relationship between height (and thereby, displacement) and applied voltage for an analytical model of a helical dielectric elastomer actuator (HDEA) including a single helical period, and a corresponding Finite Element Model (FEM).

FIG. 4C illustrates generally an illustrative example of a simulated relationship between height (and thereby, displacement) and applied voltage for an analytical model of a helical dielectric elastomer actuator (HDEA) including a single helical period, and a corresponding Finite Element Model (FEM). The geometrical parameters for the illustrative example of FIG. 4C include $Z_O$=1 millimeter (mm), $R_i$=1.3 mm, and $R_O$=4.6 mm. In the simulations of FIG. 4C, the elastomer material was not modeled as pre-strained.

Figure 5A:
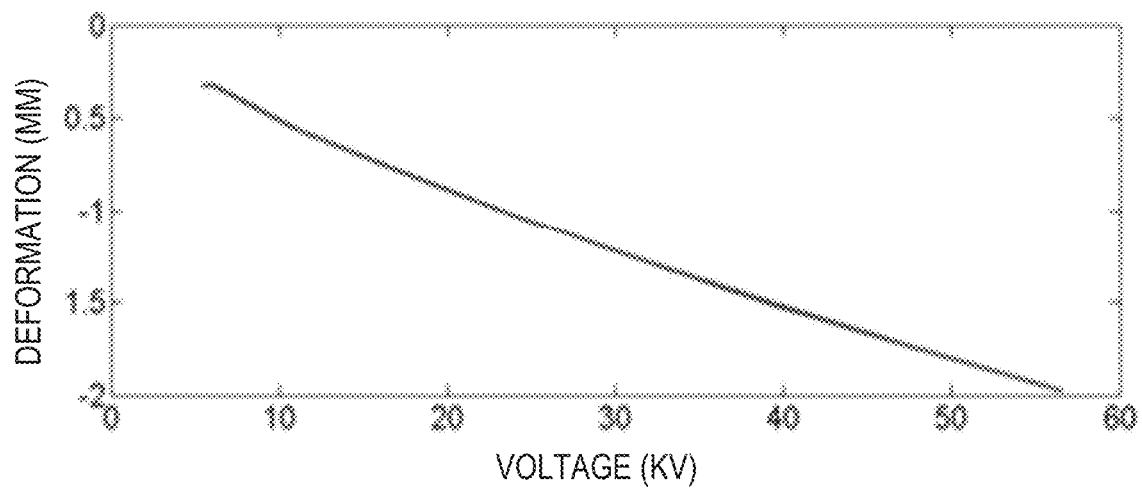
FIG. 5A and FIG. 5B illustrate generally illustrative examples of a simulated displacement (in FIG. 5A) and contraction strain (in FIG. 5B) versus applied voltage for an analytical model of a single degree-of-freedom (1-DOF) helical dielectric elastomer actuator (HDEA) including multiple layers.
Figure 5B:
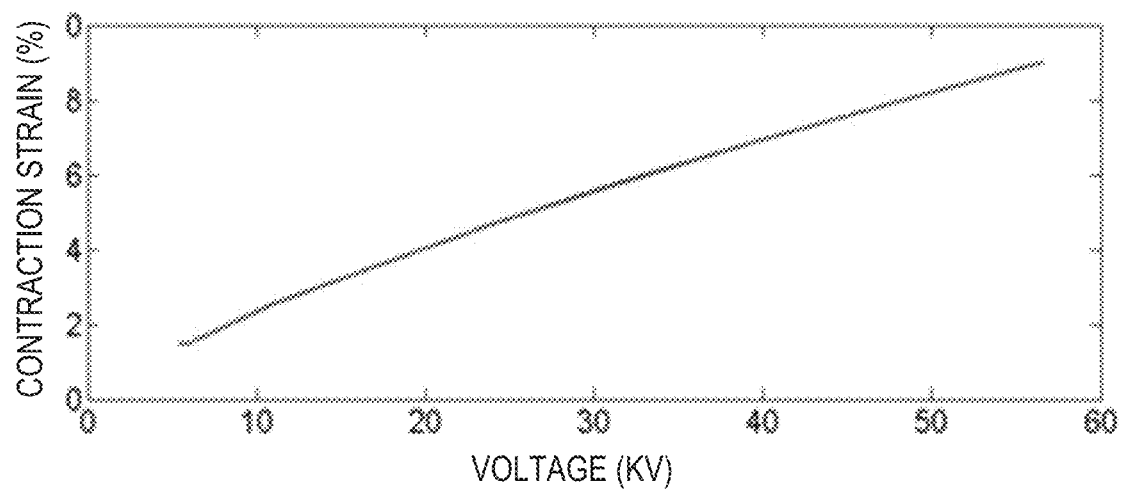

FIG. 5A and FIG. 5B illustrate generally illustrative examples of a simulated displacement (in FIG. 5A) and contraction strain (in FIG. 5B) versus applied voltage for an analytical model of a single degree-of-freedom (1-DOF) helical dielectric elastomer actuator (HDEA) including multiple layers. An analytically-determined relationship between Maxwell's pressure and electric field allows mechanical properties, e.g., pressure, to be related to voltage. As in the example of FIG. 4C, the elastomer material was not pre-strained. In the models used for FIG. 5A and FIG. 5B, the elastomer is "squeezed" by two electrodes. An elastomer having thickness of 0.5 mm and electrodes (e.g., compliant conductive regions) were modeled with a thickness of 0.05 mm were used, based on material properties of 3M VHB 4910 tape as the dielectric material. The modeled HDEA has an outer radius of 7 mm and inner radius of 2 mm. The electrode of the HDEA was offset inwards by 0.3 mm each face of the elastomer, from an exterior edge, to avoid short circuit. A Neo-Hookean model was used for modeling the analysis for the HDEA with hyperelastic behavior. Two revolutions of were modeled with a pitch of 1.1 mm. Equally distributed forces were applied along the electrode of the HDEA. From the applied forces, actuation pressure is determined to derive actuation voltage and deformation, as plotted in FIG. 5A and FIG. 5B.

Figure 6A:
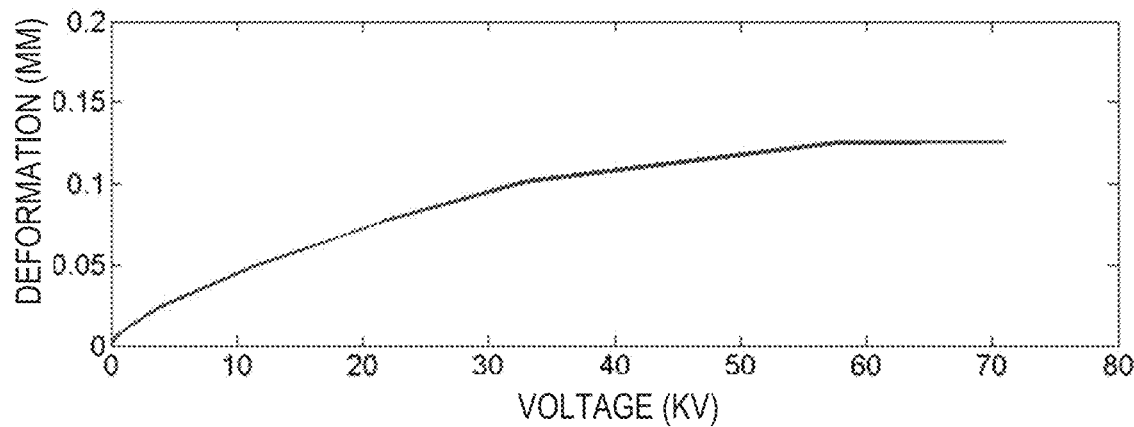
FIG. 6A and FIG. 6B illustrate generally illustrative examples of a simulated bending angle (in FIG. 6A) and contraction strain (in FIG. 6B) versus applied voltage for an analytical model of a two degree-of-freedom (2-DOF) helical dielectric elastomer actuator (HDEA) including multiple layers.
Figure 6B:
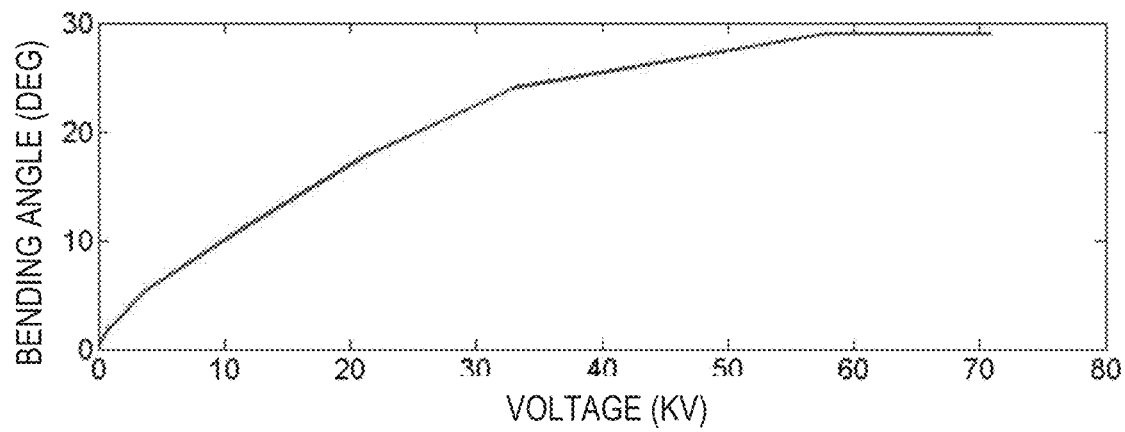

FIG. 6A and FIG. 6B illustrate generally illustrative examples of a simulated bending angle (in FIG. 6A) and contraction strain (in FIG. 6B) versus applied voltage for an analytical model of a two degree-of-freedom (2-DOF) helical dielectric elastomer actuator (HDEA) including multiple layers. The configuration used for the simulations of FIG. 6A and FIG. 6B is similar to that used for FIG. 5A and FIG. 5B, but the modeled HDEA has two identical conductive regions including a 2 mm surface gap between them (e.g., similar to the HDEA 200A of FIG. 2A). This allows each of the conductive regions to be activated independently, bending the HDEA as shown illustratively in the plot of FIG. 6A.

The simulation model includes a load applied on one side of the electrode to identify whether the modeled HDEA creates a bending moment. In the model, a bottom part of the HDEA is fixed and the bending angle at the tip is measured along with its displacement. For a 2-DOF HDEA, deformation in thickness as well as bending angle caused by the load were simulated. FIG. 6A illustrates generally that an HDEA can be configured not only for axial deformation but also bending deformation, by activating certain electrode patterns. Also, with increase in voltage, it can be seen that large bending angles can be generated, at least according to simulation. At 70 kV, there is total of 29-degree angle of bending for the two-layer configuration simulated in FIG. 6A and FIG. 6B. The large voltage for activation indicated by simulation is likely due to the model omitting any pre-stretch of the dielectric elastomer material.

Illustrative Examples Concerning Fabrication

A fabrication process for producing an HDEA can be difficult at least in part due to a discontinuous nature of the structure of dielectric elastomer alternated with electrode material. A thickness of the helices is generally reduced for low voltage application and for electrical insulation between the electrodes. Cutting soft elastomeric tubes to generate helical layers may not be the most robust fabrication technique because dimensions of the electrode and elastomers are generally not held to precise tolerance. Thick elastomer and high activation voltage, may make an assembly unfavorable for multiple applications. The present inventor has recognized, among other things, that other, different manufacturing techniques can be used, such as mold casting and choice of suitable materials. However, due to complex geometry for HDEA structures, the process of molding or machining may still present drawbacks. In order to overcome these challenges, in another approach, additive manufacturing is considered as a solution to deposit (e.g., "print") the conductive regions and dielectric elastomer for an HDEA structure FIG. 7A and FIG. 7B illustrate generally examples showing generally how dielectric material and compliant conductive material layers might be fabricated using a deposition technique such as printing or dispensing, with FIG. 7A showing an initial or early state 700A of such fabrication, and FIG. 7B showing a later state 700B wherein multiple layers of material have been built up. Additive manufacturing techniques, such as shown illustrative in FIG. 7A and FIG. 7B, can provide great flexibility. For example, different patterns and shapes can be used by altering a program provided to a digitally-controlled additive manufacturing apparatus In the illustrative example of FIG. 7A and FIG. 7A, a first dispenser 760 (e.g., a first nozzle) can deposit a first dielectric material defining a first dielectric layer 706, such as including a polymer material, and a second dispenser 720 (e.g., a second nozzle) can deposit a conductive material 702 on a surface of the first dielectric layer to provide a first compliant electrode. As shown illustratively in FIG. 7B, one or more of the dispensers 720 and 760 or the HDEA structure being fabricated can be moved (e.g., translated or rotated), such that the deposition of the dielectric material 706 and conductive material 702 follow a defined path, such as a circular path. As successive layers are deposited, a helical structure is established as shown in FIG. 7B, illustratively. As mentioned in relation to other examples, one or more leads such as leads 708A, 708B, 708C, 708D, 708E, or 708F can be fabricated, such as using deposition or using other techniques, to provide electrical interconnections to deposited regions including the compliant conductive material.

A deposition flow rate or movement parameters such as rotational or translation rate can establish a "print speed," and such a speed can impact structural stability and cure. For example, if a solvent vehicle is used for one or more of the dielectric material 706 or the conductive material 702, a certain duration can be allocated to evaporating such a solvent or allowing for a polymer to cure, as illustrative examples. Drying or curing can be accelerated such as using heat or including features such as heating elements to be placed upon or nearby the HDEA structure during or after deposition. For example, an additional drying technique can be used in situ during deposition. Without being bound by theory, various materials are believed suitable for use in additive manufacturing of HDEA structures. For example, silicone-based elastomers can provide one or more of reproducible actuation upon activation, inherent softness, and compliance, but such elastomers may provide a low relative dielectric constant. An acrylic elastomer, such as the 3M VHB series (available from the 3M Company, St. Paul, Minn.), is another material, and acrylic elastomers can provide high performance in terms of strain and pressure, but usually in the presence of pre-stretching.

A polyurethane can provide a high relative dielectric permittivity constant (e.g., above 7), as compared to silicone or acrylic elastomers (e.g., having relative permittivities in the range of about 2.5 to about 4). Polyurethanes can provide significantly reduced electrical resistivity. Generally, electrodes of DEA must be soft and sustain large deformation while remaining conductive (e.g., providing "compliant" conductive regions). Accordingly, metallic electrodes like silver-loaded or copper-loaded polymers can be used. In one approach, a conductive region can be formed by depositing silver flakes, such as available as CB028 from E.I. du Pont de Nemours and Company (DuPont Microcircuit Materials, Research Triangle Park, N.C.). The conductive region can be buried between silicone layers. A silver-loaded silicone can be used to form both conductive and dielectric regions, such as by varying an amount of silver flakes loading the silicone.

In an example, a silicone-based ink can be used as a part of additive manufacturing. In dielectric elastomer actuator development, electromechanical instability (EMI) is regarded as a significant factor in preventing DEAs from achieving large voltage-induced deformations. Silicone based DEAs generally achieve a large voltage-induced deformation at a lower electric field magnitude as compared to other materials, helping to suppress or eliminate EMI.

As an illustrative example, an nScrypt SmartPump™ equipped with nTip™ (available from nScrypt Inc., Orlando, Fla.) can print lines as small as about 25 microns, accommodating a wide range of materials from 1 cP (centipoise) to over 1 million cP. As mentioned above, an HDEA structure can be provided using silicone and a silver flake paste. The SmartPump™ has demonstrated that silicone can be printed in a vertical stack with a high aspect ratio, and an electrode structure can be fabricated such as having a thickness of 50 micrometers.

Some fabrication challenges lie even with additive fabrication techniques. The region where the elastomer and conductive region (e.g., electrodes) coincide is generally controlled to provide an absence of air traps or other voids which can cause dielectric failure, or arcing, for example. Furthermore, the elastomer needs to withstand the heat created as a resultant of the high voltage. Despite the additive manufacturing being able to print small features, such as about 25 microns as mentioned in another illustrative example herein, a curing time of the electrode and elastomer structures can vary.

Numerous criteria can be taken into consideration for the material selections of the HDEA. Considerations can include whether materials are available in resin form for additive manufacturing, and how such materials respond chemically or electrically to high temperature. As an illustrative example, silver electrodes and polyurethane elastomer are considered for a helical DEA which can be combined with another layer including silicone. In general, DEAs can have an elastomer membrane that is about 20 to about 100 µm thick, since the fabrication of elastomer membrane that is thinner is challenging. The actuation voltage of DEAs can typically be reduced by tailoring the material parameters of the elastomer membrane or by reducing a membrane thickness. The material properties of hyperelasticity and dielectric constant can be modulated by addition of different types of fillers, as mentioned above.

In another example, PDMS micro beads can be used such as for providing an elastomer in a hydrophilic support bath that is configured to enable freeform fabrication of complex structures. For example, printing can be performed by extruding PDMS pre-polymer in a support bath consisting of Carbopol gel. The Carbopol gel acts as a support for a hydrophobic PDMS polymer. A design description of the HDEA structure can be imported and processed and then fabricated layer-by layer. After the PDMS has been extruded, it can be cured (e.g., for 72 hours at room temperature or at 65 degrees Celsius for 2 hours). The curing of the PDMS allows the Carbopol bath to be liquefied by monovalent cations such as PBS solution combined with mechanical agitation. After the support bath is liquefied, the printed HDEA can be removed. Various fillers can be used. For example, titanate-filled PDMS can exhibit a relative dielectric constant above about 5, whereas un-filled PDMS has a relative dielectric constant of about 2.3 to about 2.8. A relative dielectric constant can be further enhanced, such as by adding other materials, for example, $Ba_{0.55}Sr_{0.45}TiO_3$ and $MgCaTiO_2$.

FIG. 8 illustrate generally an example showing generally how multiple dielectric material and multiple compliant conductive material layers might be fabricated serially using a deposition technique such as printing or dispensing. A first dielectric material dispenser 860A can deposit a first dielectric material 806A such as to form an elastomer helix. A first conductive material dispenser 820 can provide a first conductive region 802, such as defining one or more electrodes on a first surface of a layer including first dielectric material 806A. A second dielectric material dispenser 860B can deposit a second dielectric material 806B, such as to form another elastomer or other layer. The first and second dielectric materials 806A and 806B can be the same, or can be different materials. A second conductive material dispenser 840 can provide a second conductive region 804, such as defining one or more electrodes on an opposite second surface of the layer including the first dielectric material 806A. The first and second conductive materials comprising the regions 802 and 804 can be the same, or can be different. As successive layers are built up, a helical structure can be established, such as by continuing deposition upon previous layers (e.g., upon an earlier-deposited layer 870), similar to the approach shown illustratively and described in relation to FIG. 7A and FIG. 7B. The dispensers can operate contemporaneously, in a staggered manner (having some durations where multiple dispensers are dispensing material), or serially (in which dispensing of each material is non-overlapping in time). Use of multiple dispensers (e.g., nozzles or printheads) as shown in FIG. 7A, FIG. 7B, and FIG. 8 is illustrative. A single-dispenser approach can be used, such as building up layers in segments or sectors in a piece-wise manner. For example, a single dispenser can be supplied with a polymer liquid or gel, and a conductive material or other filler can be selectively mixed or omitted during dispensing operations to provide different material layers.

Figure 9A:
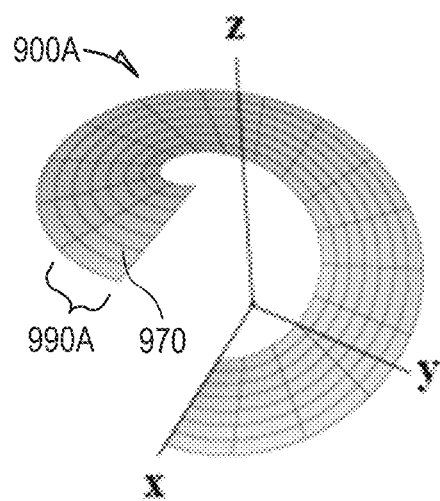
FIG. 9A and FIG. 9B show illustrative examples of piece-wise constructed helical structures, such as could be fabricated to approximate a continuously-curved helical structure.
Figure 9B:
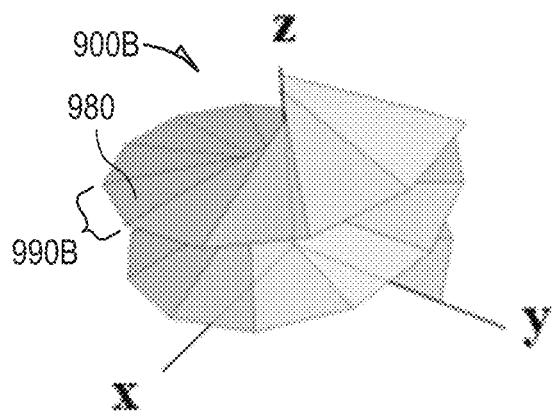

FIG. 9A and FIG. 9B show illustrative examples 900A and 900B of piece-wise constructed helical structures, such as could be defined and fabricated to approximate a continuously-curved helical structure. As mentioned above, fabricate an HDEA can be challenging, such as due to the complexity of a helical shape. A continuously-curved helicoid can be approximated using a piece-wise fabricated structure. For example, a grid or a mesh can be defined comprising smaller shapes that are formed after discretization of a continuously-curved helicoid geometry. Grid or mesh elements can be one or more of defined and fabricated on an element-by-element basis, such as in sectors (e.g., a sector 990A as shown in FIG. 9A or a sector 990B as shown in FIG. 9B). Grid elements such as an element 970 can include a portion of a sector 990A as shown in FIG. 9A, or another element shape such as a triangular element 980 as shown in FIG. 9B. As an illustrative example, a helicoid can be discretized in an origami-like manner, and it can be referred to as a spiral pleat structure. For example, in FIG. 9B, the helicoid is shown as divided into multiple right-angle triangles. In an additive manufacturing approach, each element of the grid such as the triangular element 980, can be deposited, such as one at a time before advancing to the next element, to provide a layered structure approximating a continuously-curved helicoid.

Figure 10:
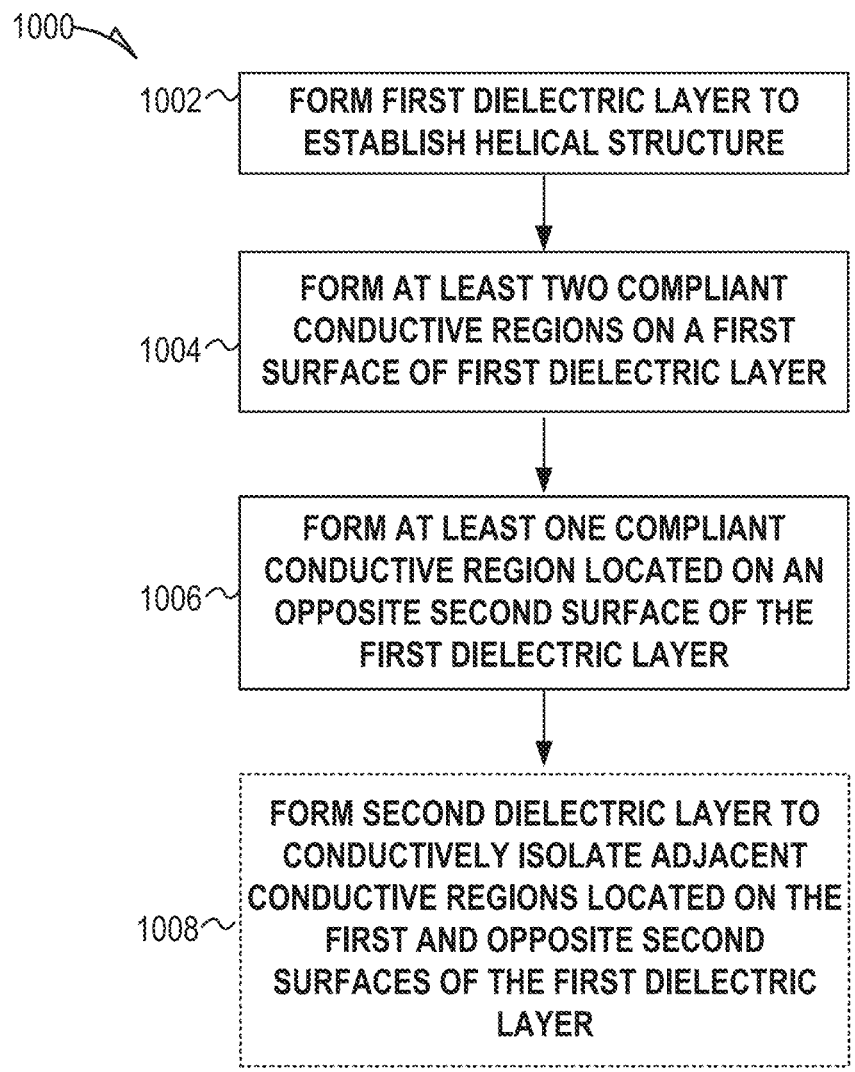
FIG. 10 illustrates generally a technique, such as a method, that can include forming a first dielectric layer and at least two compliant conductive regions on a surface of the first dielectric layer, such as to provide a helical dielectric elastomer actuator (HDEA) having multiple degrees of freedom.

FIG. 10 illustrates generally a technique 1000, such as a method, that can include forming a first dielectric layer and at least two compliant conductive regions on a surface of the first dielectric layer, such as to provide a helical dielectric elastomer actuator (HDEA) having multiple degrees of freedom. In an example, a first dielectric layer can be formed at 1002 to establish a helical structure. Techniques for forming the first dielectric layer can include one or more of cutting, stamping, molding, wrapping, and printing (or otherwise depositing) a dielectric material to provide a dielectric layer, such as an elastomer layer. At 1004, at least two compliant conductive regions can be formed on a first surface of the first dielectric layer, such as to provide an HDEA having at least two degrees of freedom. The compliant conductive regions can be deposited (e.g., printed), adhered, wrapped, or otherwise formed. At 1006, a compliant conductive region can be formed, such as located on an opposite second surface of the first dielectric layer. When energized, conductive regions on opposite surfaces of the dielectric layer can induce displacement in the dielectric layer such as contraction. Optionally, at 1008, a second dielectric layer can be formed to conductively isolate adjacent conductive regions located on the first and opposite second surfaces of the first dielectric layer in a stacked helix configuration (e.g., as shown illustratively in FIG. 2A, for example). One or more of the dielectric layers or conductive regions mentioned above can be treated after being formed, such as to cure a polymer material or drive out a solvent carrier, according to various examples.

Figure 11:
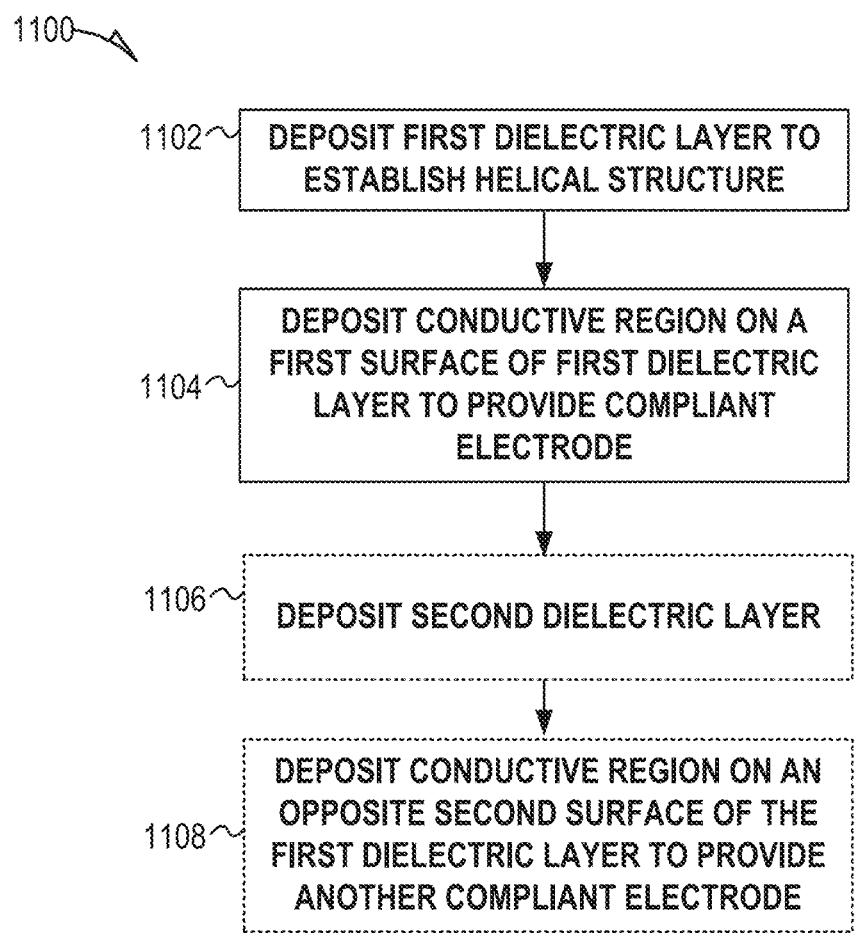
FIG. 11 illustrates generally a technique, such as a method, that can include depositing a first dielectric layer to provide a helical dielectric elastomer actuator (HDEA).

FIG. 11 illustrates generally a technique 1100, such as a method, that can include depositing a first dielectric layer to provide a helical dielectric elastomer actuator (HDEA). At 1102, a first dielectric layer can be deposited, such as using an additive manufacturing technique such as printing, as mentioned in relation to other examples described in this document. At 1104, a conductive region can be deposited on a first surface of the first dielectric layer to provide a first compliant electrode. Successive layers can be built up to provide a helical structure. As an illustrative example, optionally, at 1106, a second dielectric layer can be deposited, and at 1108 another conductive region can be deposited on a second surface of the first dielectric layer opposite the first surface, to provide a second compliant electrode. In this manner, successive layers can be built up to provide a HDEA such as shown illustratively in the examples of one or more of FIG. 1A, FIG. 1B, FIG. 2A, FIG. 2B, or FIG. 3, and such as using fabrication techniques mentioned in relation to the examples of one or more of FIG. 8A, FIG. 8B, FIG. 9A, or FIG. 9B.

Various Notes

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein, such as involving automated or semi-automated fabrication techniques, can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A helical dielectric elastomer actuator (HDEA), comprising:
   a first dielectric region comprising an elastomer defining a helix;
   at least two compliant conductive regions located on a first surface of the first dielectric region; and
   at least one compliant, conductive region located on an opposite second surface of the first dielectric region;
   wherein the at least two compliant conductive regions are arranged to be energized with respect to the at least one compliant conductive region in a manner providing at least two mechanical degrees of freedom for operation of the HDEA.

2. The helical dielectric elastomer actuator of claim 1, wherein the at least two compliant, conductive regions are located at different angular positions around a central hollow region defined by the first dielectric region.

3. The helical dielectric elastomer actuator of claim 2, wherein the at least two compliant conductive regions are arranged to provide axial displacement along a long axis of the HDEA when energized together at the same polarity and voltage with respect to a common electrode, and to provide a bending displacement when energized separately using one or more of a polarity or voltage differing from each other with respect to the common electrode.

4. The helical dielectric elastomer actuator of claim 2, wherein the at least two compliant conductive regions are arranged to provide axial displacement along a long axis of the HDEA when energized together at the same polarity and voltage with respect to a common electrode, and to provide a torsional displacement when energized separately using one or more of a polarity or voltage differing from each other with respect to the common electrode.

5. The helical dielectric elastomer actuator of claim 1, comprising a second dielectric region defining a helix, the second dielectric region stacked with the first dielectric region to define a stacked helix, the second dielectric region isolating adjacent compliant conductive regions from each other in the stacked helix.

6. The helical dielectric elastomer actuator of claim 1, wherein the first dielectric region is pre-stretched.

7. The helical dielectric elastomer actuator of claim 1, wherein the first dielectric region includes silicone.

8. The helical dielectric elastomer actuator of claim 7, wherein at least one of the compliant conductive regions on the first or second surfaces of the first dielectric region includes silver or copper.

9. The helical dielectric elastomer actuator of claim 1, wherein the at least two compliant conductive regions on the first surface of the first dielectric region are electrically coupled to leads and conductively isolated from each other, the leads located along a longitudinal axis of the HDEA.

10. The helical dielectric elastomer actuator of claim 9, comprising segments defining respective regions along the longitudinal axis of the HDEA including respective leads to feed respective conductive regions in the segments.

11. The helical dielectric elastomer actuator of claim 1, wherein at least one of the compliant conductive regions on the first or second surfaces of the first dielectric region includes conductive flakes.

12. A method for providing a helical dielectric elastomer actuator (HDEA), the method comprising:
depositing a first dielectric material comprising an elastomer to define a first dielectric layer; and
depositing a first conductive material on a surface of the first dielectric layer to define at least two first compliant electrodes arranged to be energized with respect to second compliant electrode in a manner providing at least two mechanical degrees of freedom for operation of the HDEA, the second electrode isolated from the at least two first compliant electrodes by the first dielectric material;
wherein the first dielectric layer and the first conductive material define a helical structure extending in a longitudinal direction.

13. The method of claim 12, comprising depositing a second dielectric material to define a second dielectric layer and a second conductive material on surface of the second dielectric layer to provide the second compliant electrode, the first compliant electrodes located on a surface of the first dielectric layer and the second compliant electrode located on an opposite surface of the first dielectric layer in a stack defined by the first and second dielectric layers.

14. The method of claim 12, wherein the depositing the first dielectric layer and the depositing the first conductive material include dispensing or printing the first dielectric layer and the first conductive material using respective nozzles.

15. The method of claim 12, wherein the helical structure is established by depositing successive layers of the first dielectric material and the first conductive material in a stack by following a curved path.

16. The method of claim 15, wherein the curved path defines a circle.

17. The method of claim 12, wherein the first dielectric material includes silicone.

18. The method of claim 12, wherein the first conductive material includes silver or copper.

19. The method of claim 12, wherein the first conductive material includes conductive flakes.

20. A method for providing a helical dielectric elastomer actuator (HDEA), the method comprising:
depositing a first dielectric material comprising an elastomer to define a first dielectric layer; and
depositing a first compliant conductive material on a surface of the first dielectric layer, the first compliant conductive material defining at least two compliant conductive regions arranged to be energized in a manner providing at least two mechanical degrees of freedom for operation of the DEA;
wherein the first dielectric layer and the first compliant conductive material define a helical structure extending in a longitudinal direction;
wherein the depositing the first dielectric layer and the depositing the compliant conductive region include depositing the first dielectric layer and the first compliant conductive material using respective dispensers.

* * * * *